United States Patent [19]

Numata

[11] 4,283,793
[45] Aug. 11, 1981

[54] MUTING SIGNAL GENERATION CIRCUIT FOR AN FM RECEIVER

[75] Inventor: Tatsuo Numata, Tokyo, Japan

[73] Assignee: Pioneer Electronic Corporation, Tokyo, Japan

[21] Appl. No.: 81,240

[22] Filed: Oct. 2, 1979

[30] Foreign Application Priority Data

Oct. 6, 1978 [JP] Japan .................. 53/123743

[51] Int. Cl.³ ............................................. H04B 1/16
[52] U.S. Cl. ............................................. 455/213
[58] Field of Search ......................... 455/212, 213

[56] References Cited

U.S. PATENT DOCUMENTS 2,959,673  11/1960  Magnuski ...................... 455/213
3,889,192  6/1975  Schiebelhuth et al. ......... 455/212 X Primary Examiner—Robert L. Richardson
Attorney, Agent, or Firm—Sughrue, Rothwell, Mion, Zinn and Macpeak

[57] ABSTRACT

An improved muting signal generation circuit of an FM receiver of the type in which the deviation of an FM detection signal relative to a predetermined level is detected. When the deviation of the FM detected signal is above or below a predetermined value, a muting signal is generated. A band elimination filter is provided for eliminating the frequency components of an information signal contained in the FM detection signal. A detuning detection circuit detects detuning in response to the output of the band elimination filter. A muting signal generation circuit generates a muting signal in response to the detection output of the detuning detection circuit.

10 Claims, 3 Drawing Figures

MUTING SIGNAL GENERATION CIRCUIT FOR AN FM RECEIVER

BACKGROUND OF THE INVENTION

The invention relates to muting signal generation circuits for an FM receiver and more particularly to a muting signal generation circuit for generating a muting signal during periods of detuning or when an S/N ratio is degraded.

In a receiver, a muting circuit is operated to thereby mute a line output during times when detuning occurs, for example, during selection of broadcasting stations or when the S/N ratio is degraded such as may be caused by, for example, mutual modulation interference, multipass interference or adjacent channel interference.

In FIG. 1, there is shown a block diagram of a prior art muting control section of an FM receiver in which the output signal $V_O$, which varies in accordance with the frequency changes in a received signal as shown in FIG. 3, of an FM detector 1 is applied to both a low-pass filter 2 and a high-pass filter 3. The low-pass filter 2 passes only the d.c. component of the detected output signal $V_O$. With this arrangement, the output of the low-pass filter 2 increases in proportion to the d.c. component of the detected output signal $V_O$ and hence with undesirable deviations in the frequency f to which the receiver is tuned. The output of the low-pass filter 2 is applied to the next stage, the detuning detector 4. When the frequency to which the receiver is tuned is above or below a predetermined value relative to a central frequency $f_0$ of a received signal from a broadcasting station, the output signal from the detuning detector correspondingly shifts above or below a reference level $V_{ref}$. The detuning detector 4 produces, for example, a high level signal when the shift of the detected output signal $V_O$ relative to the reference voltage $V_{ref}$ is equal to or above a predetermined value. The output signal from the detuning detector 4 operates a muting signal generator 5 which generates a muting signal when the output signal from the detuning detector is at the high level for a predetermined period of time. The muting control circuit 6 is actuated in response to the muting signal.

On the other hand, only high-frequency components which are produced when the S/N ratio is degraded are passed by the high-pass filter 3 from the FM detection output signal $V_O$. The high-frequency noise passed therethrough is then subjected to detection and smoothing in a noise detector 7 which receives its input from the high-pass filter 3. The muting signal generator 5 is operated in accordance with the output of the noise detector 7.

The above-described prior art arrangement is disadvantageous in that the circuit construction is relatively complicated because both a detuning detector 4 and a high-frequency noise detector 7 are required. In addition, when the circuit is constructed on an IC chip, it is further disadvantageous in that two pins are required for connecting the respective outputs of the low-pass filter 2 and the high-pass filter 3 to the IC circuit.

SUMMARY OF THE INVENTION

Accordingly, an object of the invention is to provide a muting signal generation circuit for an FM receiver in which both the detuning detector and high frequency noise detector are implemented in a single circuit which is adapted for construction as an IC chip.

In a muting signal generation circuit of an FM receiver according to the invention, the deviation of the FM detected signal relative to a predetermined level is detected and the muting signal is generated when the deviation is equal to or above a predetermined value. To this effect, the detected FM signal is applied to the muting signal generation circuit by coupling it through a band elimination filter which removes the information signal components of the detected FM signal.

Specifically, a d.c. signal is produced in response to the detected FM signal which varies linearly with respect to a frequency f as shown in FIG. 3. The FM detected signal may contain high-frequency noise components superimposed on the d.c. component. Only the high-frequency component and the d.c. component are passed by the band elimination filter to thereby eliminate the information signal component. The output of the band elimination filter is utilized as an input to the muting signal generation circuit. As a consequence, detuning and noise are simultaneously detected and a desired muting operation can be carried out with a single muting signal generation circuit. Furthermore, only one terminal connected between the output of the band elimination filter and the detected output is sufficient, so that the circuit can easily be implemented on an IC chip.

DETAILED DESCRIPTION OF THE PREFERRED EMBODIMENTS

To facilitate an understanding of the invention, the invention will now be described with reference to the accompanying drawing.

Figure 1:
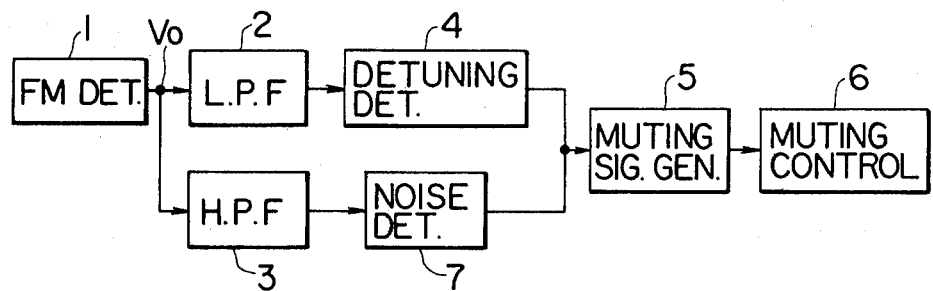
FIG. 1 is a block diagram showing a prior art muting signal generation circuit used in an FM receiver.
Figure 2:
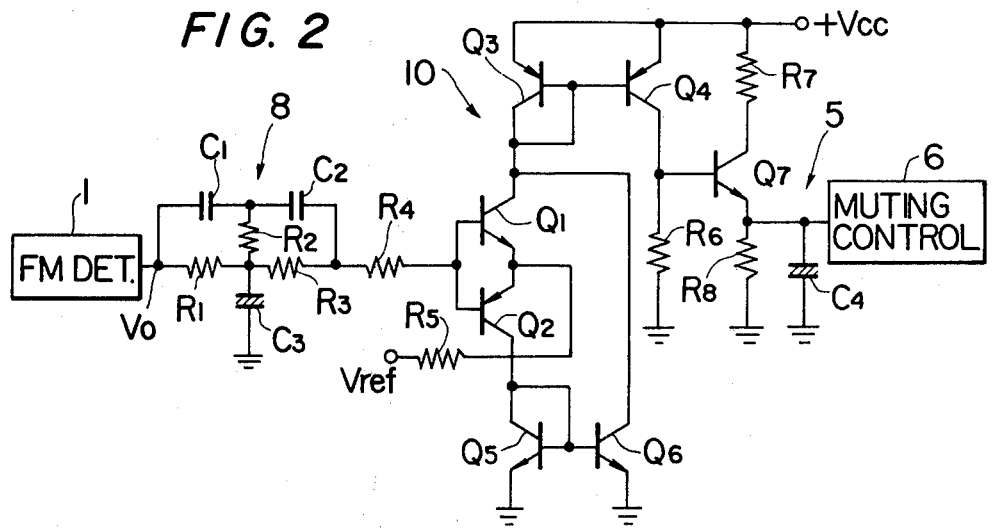
FIG. 2 is a circuit diagram showing a preferred embodiment according to the invention.

FIG. 2 is a circuit diagram showing one embodiment of the invention in which the same parts or parts having the same function are designated by the same reference numerals as used in FIG. 1. In the circuit of FIG. 2, the detected FM output signal $V_O$ from an FM detector 1 is applied to a band elimination filter 8. The band elimination filter 8 includes both a low-pass filter and a high-pass filter. The former includes a capacitor $C_3$ and resistors $R_1$ and $R_3$ and the latter capacitors $C_1$ and $C_2$ and resistors $R_2$ and $R_3$. The output of the band elimination filter 8 is applied through an input resistor $R_4$ to the input of a dual function detection circuit 10 which detects both detuning and the presence of noise.

The detection circuit 10 includes an input stage, first and second current mirror circuits and an output stage. The input stage includes an NPN transistor $Q_1$ and a PNP transistor $Q_2$ of which the bases of the respective transistors are commonly connected and to which an input signal is applied. The emitters of the respective transistors are also commonly connected to which connection is applied a reference voltage $V_{ref}$. The first current mirror circuit is constituted by a pair of PNP transistors $Q_3$ and $Q_4$ of which the bases of both and the collector of transistor $Q_3$ are connected to the collector of transistor $Q_1$. The second current mirror circuit includes a pair of NPN transistors $Q_5$ and $Q_6$ of which the bases of both and the collector of transistor $Q_5$ are connected to the collector of transistor $Q_2$. The output stage is constituted by transistor $Q_7$ connected in an emitter follower arrangement and resistors $R_6$ and $R_7$ with the base of transistor $Q_7$ connected directly to the collectors of the transistors $Q_4$ and $Q_6$.

The output produced by the emitter follower transistor $Q_7$ in the output stage is applied to a muting signal generation section 5 including a capacitor $C_4$ and a resistor $R_8$ and is concurrently applied to the input of a muting control circuit 6.

In the above-described circuit arrangement, when no high-frequency noise is superimposed on the detected output signal $V_O$, the detected output signal $V_O$ has a value equal to that of the reference voltage $V_{ref}$ provided that receiver tuning precisely is set to the center frequency $f_0$ of a received signal. In this case, both the transistors $Q_1$ and $Q_2$ are in the cut-off state and therefore the output stage transistor $Q_7$ in the detection circuit 4 is also in the off state. As a result, no muting signal is generated.

Should detuning occur, that is, in the case where the tuned frequency deviates above or below the frequency $f_0$ and is equal to or above a first critical frequency $f_1$ or equal to or below a second critical frequency $f_2$, the detected output signal $V_O$ varies in proportion to the frequency. As a result, one of the transistors $Q_1$ and $Q_2$ is rendered conductive and a corresponding one of the first and second current mirror circuits is activated. Thus, the output stage transistor $Q_7$ is rendered conductive as a result of which the capacitor $C_4$ is rapidly charged due to the low circuit impedance.

If a properly tuned condition is again attained, the detected output signal $V_O$ returns to a value substantially equal to the reference voltage $V_{ref}$ so that the activated one of transistors $Q_1$ and $Q_2$ becomes non-conductive. The transistor $Q_7$ is turned off and the capacitor $C_4$ is discharged through the resistor $R_8$. The value of $R_8$ and hence the value of the time constant $R_8C_4$ may be chosen such that the muting signal is maintained in the activated state for a predetermined amount of time after $Q_7$ has been switched off in order to prevent overly quick switching between muted and non-muted states such as may occur when a noise source is intermittent. In this manner, the muting signal is produced for a predetermined period of time.

Should high-frequency noise be present, the noise will be superimposed on the detected output signal $V_O$ which is applied through the high-pass filter in the band elimination filter 8 to the detection circuit. One of the input transistors $Q_1$ and $Q_2$ is similarly rendered conductive as in the case of detuning if the level of the noise component is sufficiently high and thus the muting signal is again generated.

Figure 3:
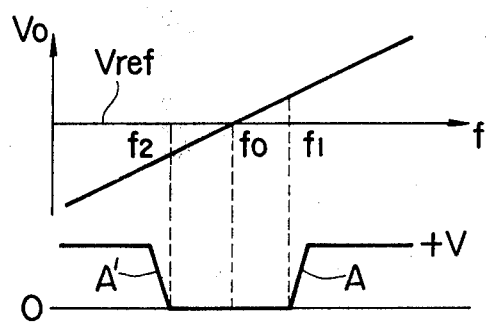
FIG. 3 is a graphical representation showing the relation between the FM detected output and the output of the detection circuit.

The input stage of the detected circuit 10 is arranged so that when the deviation of the input voltage level relative to the tuning frequency $f_0$ is above or below the base-emitter voltage $V_{BE}$, the muting signal output is generated by employing the NPN and PNP transistors. Accordingly, the circuit's detection characteristics for above and below deviation are symmetrical with respect to the tuning frequency as shown in FIG. 3 and thus prefered operating characteristics for generating the muting signal are provided.

Further, since a current mirror circuit is employed for the collector load of transistors $Q_1$ and $Q_2$, the gradient of the circuit output voltage (indicated by "A" and "A'" in FIG. 3) is equal to $R_6/R_5$ if the $h_{FE}$ of the respective transistors is large. Thus, the characteristics are symmetrical with respect to deviations in both directions and preferred operating characteristic are also thereby attained.

As described above, the present invention is advantageous in that the overall circuit arrangement is simplified due to the fact that the detection of tuning deviations and the detection of noises can be implemented by a common detection circuit.

If preferred, band elimination filter 8 can be constituted by independent high-pass filter and low-pass filter connected in parallel with each other.

It will be apparent that various modifications and changes can be made without departing from the essential scope of the invention. For example, a conventionally known tuning shift detection circuit can be employed in lieu of the detection circuit 10.

What is claimed is:

1. In an FM receiver of the type having an FM detector, a muting circuit comprising:
a band elimination filter means connected to said FM detector for eliminating the information content of the output of said FM detector and passing to an output thereof high frequency noise and the d.c. component in the FM detector output, and
circuit means connected to the output of said band elmination filter means for generating a muting output signal in response to either one of said d.c. component and said noise being above a predetermined level.

2. The muting circuit of claim 1 wherein said muting signal generating means comprises:
means for detecting variations in said detected FM signal beyond preset levels; and
means for detecting the presence of noise components having a magnitude greater than a predetermined magnitude.

3. The muting circuit of claim 2 further comprising means for producing a muting signal in response to both said detecting means.

4. The muting circuit of claim 3 further comprising means coupled to said muting signal producing means for providing said muting signal with predetermined rise and fall times.

5. A muting circuit for an FM receiver comprising:
band elimination filter means, an input of said band elimination filter means being coupled to a source of a detected FM signal;
a complementary input circuit having an input coupled to an output of said band elimination filter means;
first and second current mirror circuits coupled to said complementary input circuit; and
an amplifier circuit coupled to respond to both said first and second current mirror circuits.

6. The muting circuit of claim 5 wherein said amplifier circuit comprises an emitter follower circuit.

7. The muting circuit of claim 6 further comprising a capacitor coupled to an output of said emitter follower circuit.

8. A muting circuit for an FM receiver comprising in combination:
A. band elimination filter means, an input of said band elimination filter means being coupled to a source of a detected FM signal; and
B. a combination detecting circuit, said combination detecting circuit comprising:

(1) a complementary input circuit including a first NPN transistor and a first PNP transistor, said first NPN and said first PNP transistors having bases coupled to an output of said band elimination filter means and having emitters coupled to a source of a reference potential;

(2) a first current mirror circuit including second and third PNP transistors, said second PNP transistor having a collector and a base coupled to the collector of said first NPN transistor and the base of said third PNP transistor and the emitter of said second PNP transistor being coupled to the emitter of said third PNP transistor and to a positive terminal of a power source;

(3) a second current mirror circuit including second and third NPN transistors, said second NPN transistor having a collector and base coupled to the collector of said first PNP transistor and to the base of said third NPN transistor, the emitters of said second and third NPN transistors being coupled to a ground of said power source, and the collector of said third NPN transistor being coupled to the collector of said first NPN transistor;

(4) an emitter follower circuit including a fourth NPN transistor having a base coupled to the collector of said third PNP transistor and one terminal of a first resistor, the second terminal of which is connected to ground, a collector coupled through a second resistor to said positive terminal and an emitter coupled through a third resistor to ground.

9. The muting circuit of claim 8 further comprising a capacitor coupled to the emitter of said fourth NPN transistor.

10. The muting circuit of claim 9 wherein said band elimination filter means comprises:
fourth, fifth and sixth resistors coupled in series between said source of said detected FM signal and the bases of said first NPN and PNP transistors;
a second capacitor coupled between the junction of said fourth and fifth resistors and ground;
third and fourth capacitors coupled in series between opposite end terminals of said fourth and fifth resistors; and
a seventh resistor coupled between said junction of said fourth and fifth resistors and the junction between said third and fourth capacitors.

* * * * *